United States Patent
Lee et al.

(10) Patent No.: US 10,658,196 B2
(45) Date of Patent: May 19, 2020

(54) CHEMICAL MECHANICAL POLISHING SLURRY COMPOSITION AND METHOD FOR MANUFACTURING SEMICONDUCTOR USING THE SAME

(71) Applicant: SOULBRAIN CO., LTD., Seongnam-si, Gyeonggi-do (KR)

(72) Inventors: Hyeong Ju Lee, Seongnam-si (KR); Seok Joo Kim, Seongnam-si (KR); Kyung Il Park, Seongnam-si (KR)

(*) Notice: Subject to any disclaimer, the term of this patent is extended or adjusted under 35 U.S.C. 154(b) by 0 days.

(21) Appl. No.: 16/170,052

(22) Filed: Oct. 25, 2018

(65) Prior Publication Data
US 2019/0164778 A1 May 30, 2019

(30) Foreign Application Priority Data
Nov. 30, 2017 (KR) .......................... 10-2017-0162606

(51) Int. Cl.
| | | |
|---|---|---|
| C09G 1/00 | (2006.01) | |
| C09G 1/02 | (2006.01) | |
| C09G 1/04 | (2006.01) | |
| H01L 21/321 | (2006.01) | |
| C09K 3/14 | (2006.01) | |

(52) U.S. Cl.
CPC ............ *H01L 21/3212* (2013.01); *C09G 1/02* (2013.01); *C09K 3/1436* (2013.01)

(58) Field of Classification Search
CPC ............... C09G 1/00; C09G 1/02; C09G 1/04
See application file for complete search history.

(56) References Cited

U.S. PATENT DOCUMENTS

| | | | | |
|---|---|---|---|---|
| 2014/0154884 A1* | 6/2014 | Kato | ................. | H01L 21/31053 438/693 |
| 2014/0302752 A1* | 10/2014 | Tsuchiya | ............... | B24B 37/044 451/41 |

* cited by examiner

*Primary Examiner* — Thomas T Pham
(74) *Attorney, Agent, or Firm* — Jongkook Park

(57) ABSTRACT

A chemical-mechanical polishing slurry composition, comprising a polishing agent, an amine-based polishing activator, and a roughness adjusting agent, wherein the amine-based polishing activator is a tertiary or quaternary amine, and the roughness adjusting agent is a disaccharide. According to the slurry composition, the roughness of tungsten and silicon oxide films can be modified and the number of particles present on the wafer surface after polishing can be reduces so that defects of the wafer can be prevented.

5 Claims, No Drawings

CHEMICAL MECHANICAL POLISHING SLURRY COMPOSITION AND METHOD FOR MANUFACTURING SEMICONDUCTOR USING THE SAME

CROSS-REFERENCE TO RELATED APPLICATIONS

This application claims priority under 35 U.S.C. § 119 to Korean Patent Application No. 10-2017-0162606, filed on Nov. 30, 2017, in the Korean Intellectual Property Office, the disclosure of which is incorporated herein by reference in its entirety.

TECHNICAL FIELD

The following disclosure relates to a chemical-mechanical polishing slurry composition and a method for manufacturing a semiconductor device using the same, and more particularly, to a chemical-mechanical polishing slurry composition that reduces tungsten roughness while providing effective polishing efficiency and polishing selectivity for tungsten and various other films, and a method for manufacturing a semiconductor device using the same.

BACKGROUND

As a method for insulating elements of a semiconductor device, the shallow trench isolation (STI) process has recently been used to form a shallow trench through etching or photolithography, and to deposit a dielectric layer to fill the trench. As one step of the STI process, a planarization process is included for removing steps caused by an excessive amount of insulating material, and recently, the chemical mechanical polishing (CMP) method is the most widely employed method for this planarization process.

The CMP process is one of the methods commonly used for planarizing semiconductor devices, such as flash memory devices and the like, as a surface planarization process. In the CMP process, a wafer to be subjected to the planarization process is placed on a rotating plate, a surface of the wafer is placed in contact with the pad of a polisher, and then the rotating plate and the pad of the polisher are rotated together with the supply of a slurry to perform the polishing process. In other words, the slurry flows between a wafer surface and the pad, such that polishing of the wafer surface is performed by mechanical friction caused by polishing particles in the slurry and surface protrusions of the pad, while chemical removal is simultaneously performed by chemical reaction between the chemical components in the slurry and the wafer surface.

In the CMP process, the rotating polishing pad and the wafer come into direct contact with each other through pressure, and a polishing slurry is provided on the interfaces thereof. Therefore, the wafer surface is mechanically and chemically polished by the polishing pad to which the slurry is applied and thereby becomes flat, and the characteristics such as the polishing speed, defects on the polishing surface, dishing, erosion, and the like, differ according to the composition of the slurry.

The CMP process has been successfully applied to the planarization of dielectrics such as silicon oxide films, silicon nitride films, and the like, for a long time, and has been actively applied even to the planarization process for metal films such as tungsten (W), aluminum (Al), copper (Cu), or the like.

However, selective slurries for use with tungsten films have a problem in that erosion inevitably occurs in regions where the tungsten wiring is densified after polishing. A silicon oxide film is deposited as an insulating film on a substrate for manufacturing semiconductor devices, and a titanium (Ti)-based diffusion barrier film and a tungsten film are formed after a metal wiring or plug pattern is formed. When the metal wiring or the plug is formed by a CMP process using a selective slurry on the substrate for manufacturing semiconductor devices, severe erosion is caused by the difference in polishing speed between the tungsten film and the insulating film.

Therefore, there is a demand to provide a novel CMP slurry capable of maintaining a precise balance between surface chemical etching and surface passivation to prevent unnecessary and excessive partial etching while providing effective polishing efficiency and polishing selectivity for tungsten and various other films.

SUMMARY

An embodiment of the present invention is directed to providing a chemical-mechanical polishing slurry composition capable of reducing tungsten roughness and having effective polishing efficiency and polishing selectivity for tungsten and various other films.

Another embodiment of the present invention is directed to providing a method for manufacturing semiconductor devices using the chemical-mechanical polishing slurry composition.

The present invention is not limited to the above-described technical problems, and other technical problems that are not mentioned may be clearly understood from the following description by those skilled in the art to which the present invention pertains.

The present invention provides a chemical-mechanical polishing slurry composition, comprising a polishing agent, an amine-based polishing activator, and a roughness adjusting agent.

Herein, the amine-based polishing activator is a tertiary or quaternary amine, and the roughness adjusting agent may be a disaccharide.

The tertiary amine-based polishing activator may include Chemical Formula 1, as follows:

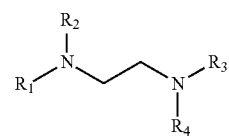

[Chemical Formula 1]

Wherein each of $R_1$ to $R_4$ is any one selected from the group consisting of hydrogen, a hydroxyl group, and a C1-C5 alkyl group.

The quaternary amine-based polishing activator may include Chemical Formula 2, as follows:

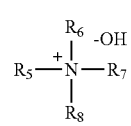

[Chemical Formula 2]

Wherein each of $R_5$ to $R_8$ is a substituted or unsubstituted C1-C5 alkyl group.

The amine-based polishing activator may be any one selected from the group consisting of tetramethylethylenediamine, tetraethylethylenediamine, ethylenediamine, tetramethyl ammonium hydroxide, tetraethyl ammonium hydroxide, tetrahydroxy ethylethylenediamine, and a combination thereof.

The amine-based polishing activator may be added in an amount of 1 to 1,000 ppm.

The disaccharide may be any one selected from the group consisting of sucrose, lactose, maltose, trehalose, turanose, and a combination thereof.

The disaccharide may be added in an amount of 1 to 1,000 ppm.

The chemical-mechanical polishing slurry composition may further comprise a polishing agent etching inhibitor.

After a chemical-mechanical polishing process, for 3 times of cumulative washing, the chemical-mechanical polishing slurry composition may have a residual amount of polishing agent that is 1.1 to 1.4 fold larger than that of 1 time washing.

To solve the above-described technical problems, another aspect of the present invention provides a method for manufacturing a semiconductor device, comprising a step of polishing using the chemical-mechanical polishing slurry composition.

DETAILED DESCRIPTION OF EMBODIMENTS

Hereinafter, the present invention is described in more detail. Meanwhile, the following description is only provided as one embodiment of the present invention, and thus the present invention is not limited thereto, but is merely defined by the scope of the following claims.

In addition, terms used in the present invention are used to only describe specific embodiments, and are not intended to limit the invention. The singular forms "a," "an," and "the" also include the plurality of expressions, unless clearly stated otherwise in the context.

Further, 'including' or 'comprising' any components throughout the specification of the present invention will be understood to imply that other components may be further included, rather than indicating the exclusion of any other components, unless specifically stated otherwise.

In the present specification, all the compounds or substituents may be substituted or unsubstituted unless otherwise specified. Here, 'substituted' means that hydrogen is substituted with any one selected from the group consisting of a halogen atom, a hydroxyl group, a carboxyl group, a cyano group, a nitro group, an amino group, a thio group, a methylthio group, an alkoxy group, a nitrile group, an aldehyde group, an epoxy group, an ether group, an ester group, a carbonyl group, an acetal group, a ketone group, an alkyl group, a cycloalkyl group, a heterocycloalkyl group, an allyl group, a benzyl group, an aryl group, a heteroaryl group, a derivative thereof and a combination thereof, but is not limited thereto.

Further, the term 'combination thereof' as used herein means that two or more substituents are bonded to each other through a single bond or a linking group, or two or more substituents are linked by condensation, unless specifically stated otherwise.

The chemical-mechanical polishing slurry composition according to an aspect of the present invention may include a polishing agent, an amine-based polishing activator, and a roughness adjusting agent, wherein the amine-based polishing activator is a tertiary or quaternary amine, and the roughness adjusting agent is a disaccharide.

The amine-based polishing activator is employed for the purpose of preventing the corrosion of a polisher and a polishing plate made of a metal, and simultaneously for the purpose of improving the dispersion stability of the polishing agent while accelerating polishing. Tertiary and quaternary amines, which are basic materials, may perform the functions of maintaining an automatic polishing stop function while increasing the pH. The tertiary amine-based polishing activator may include Chemical Formula 1 below:

[Chemical Formula 1]

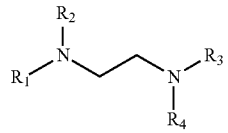

wherein each of $R_1$ to $R_4$ may be any one selected from the group consisting of hydrogen, deuterium (D), a hydroxyl group, and a C1-C5 alkyl group.

Specific examples of the tertiary amine may include any one selected from the group consisting of tetramethylethylenediamine, tetraethylethylenediamine, ethylenediaminetetrahydroxy ethylethylenediamine, triethylamine, tripropylamine, tributylamine, tripentylamine, trioctylamine, and tribenzylamine. Preferably, the tertiary amine may be any one selected from the group consisting of tetramethylethylenediamine, tetraethylethylenediamine, ethylenediamine and tetrahydroxy ethylethylenediamine, but it is not limited thereto.

The quaternary amine-based polishing activator may include Chemical Formula 2 below:

[Chemical Formula 2]

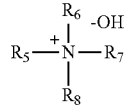

wherein each of $R_5$ to $R_8$ may be a substituted or unsubstituted C1-C5 alkyl group.

Specific examples of the quaternary amine may include at least any one selected from the group consisting of tetramethylammonium hydroxide, tetraethylammonium hydroxide, and choline, and preferably, may be tetramethylammonium hydroxide or tetraethylammonium hydroxide, but it is not limited thereto.

The composition comprising the amine-based polishing activator enables a high polishing speed of the insulating film to be realized even at a low polishing agent content due to an interaction with a surface charge of the polishing agent through the addition of the tertiary or quaternary amine, and thus it is possible to achieve improved performance in the prevention of scratches and particle defects of the chemical-mechanical polishing slurry composition, as well as to improve the oxide film polishing speed in a wide pH range.

The amine-based polishing activator may be included in an amount of 1 to 1,000 ppm, and more preferably 0.01 to 0.05 wt %, based on the total amount of the chemical-mechanical polishing slurry composition. When the content of the amine-based polishing activator is less than 1 ppm, it is difficult to control polishing of the oxide film, and when the content of the amine-based polishing activator exceeds 1,000 ppm, the oxide film may not be polished.

The slurry composition may further include a roughness adjusting agent capable of adjusting the roughness of tungsten, and the surface roughness of a polishing surface may be lowered through the (surface) roughness adjusting agent to prevent the occurrence of scratches on a polishing surface. The surface roughness adjusting agent may include a cellulose-based material, and more preferably, may be a disaccharide. The disaccharide may facilitate polishing by binding hydroxy groups in a monosaccharide with electrons to promote the oxidation of a metal layer. Further, since the disaccharide may act to bind to and remove impurities such as a polishing agent, and the like, after polishing, it may serve to contribute to the prevention of defects on a tungsten surface as well as to control surface roughness. Therefore, the slurry composition according to an embodiment of the present invention may reduce the amount of erosion occurring during the polishing of a patterned wafer and minimize the occurrence of tungsten defects, while simultaneously maintaining the amount of polishing with respect to tungsten.

The disaccharide may comprise glucose or fructose as a unit monosaccharide, and may preferably be any one selected from the group consisting of sucrose, lactose, maltose, trehalose, turanose, and a combination thereof.

The roughness adjusting agent (disaccharide) may be added in an amount of 0.001 to 0.1 wt %, based on the total amount of the composition. When the content of the roughness adjusting agent is less than 1 ppm, the effects of controlling roughness and reducing the amount of erosion and defects may be insignificant, and when the content of the roughness adjusting agent exceeds 1,000 ppm, the corrosion speed of tungsten may be high, such that dishing and erosion may be accelerated, which may adversely affect the planarization process.

The polishing agent may be a conventional metal oxide particle. Preferably, the polishing agent may be ceria ($CeO_2$), silica ($SiO_2$), alumina ($Al_2O_3$), zirconia ($ZrO_2$), titania ($TiO_2$), germania ($GeO_2$) or a mixture thereof, and more preferably, colloidal silica. Colloidal silica is also called silica sol, and it means that solid silica particles are stably dispersed in a liquid such as water or an organic solvent without being precipitated or agglomerated. The colloidal silica may be prepared by various methods such as dialysis, electrodialysis, peptization, acid-neutralization, ion exchange, and the like. Use of colloidal silica is advantageous since a higher polishing speed of silicon oxide film may be achieved than for polishing agents such as fumed silica or alumina.

It is preferable that the colloidal silica used as the polishing agent has a particle size of 20 nm to 120 nm and is spherical.

It is possible to use only colloidal silica having the same size or to mix colloidal silica particles having different sizes as the polishing agent. When the particle size of the polishing agent is less than 20 nm, the polishing efficiency of a substrate may be lowered, and defects may easily occur on a metal film. When the particle size of the polishing agent exceeds 120 nm, the dispersion stability of the slurry may be adversely affected and the frequency of occurrence of scratches may increase. Further, a large amount of polishing agent is required to achieve the polishing speed. Therefore, it is possible to use colloidal silica having an average particle diameter in the above-described range.

A content of the colloidal silica may be 0.1 to 5 wt % based on the total amount of the polishing composition. When the content of the colloidal silica is excessively small, the polishing speed may be lowered. When the content of the colloidal silica is excessively large, problems may occur in the view of dispersion stability. Therefore, the content of colloidal silica may be controlled to be within the above-described range.

The chemical-mechanical polishing slurry composition may further include a polishing agent etching inhibitor. The etching inhibitor is useful for selective etching processes, acting by maintaining the etching speed of any one of a silicon nitride film and the like, while suppressing the etching of other films such as a silicon oxide film and the like. The etching inhibitor may be any one selected from the group consisting of an alcohol, glycine, histidine and a benzotriazole. Specifically, the etching inhibitor may be one or more selected from the group consisting of 5-methyl-1H-benzotriazole, 2,2'-[[(5-methyl-1H-benzotriazole-1-yl)-methyl]imino]bisethanol), 1,2,4-triazole, 1,2,3-triazole, and 1,2,3-triazole. The etching inhibitor of the slurry composition prepared according to an embodiment of the present invention may be included at a concentration of 0.001 to 0.1 wt %, and more preferably 0.05 wt %. When the content thereof is excessively small, no effect of adding the etching inhibitor can be expected at all. When the content is excessively large, the degree of improvement of selectivity is reduced, there is no significant difference, and it is difficult to prepare an etchant due to an increase in the viscosity caused by polymer material.

In addition, the chemical-mechanical polishing slurry composition may further comprise a tungsten polishing accelerator. Since the chemical-mechanical polishing slurry composition further comprises the tungsten polishing accelerator, the selectivity (or non-selectivity) of tungsten and oxide film may be freely adjusted, such that the composition may be prepared by freely selecting a selective or nonselective slurry for tungsten and oxide film so as to meet usage requirements. Specific examples of the tungsten polishing accelerator may include, but are not limited to, any one selected from the group consisting of ammonium metavanadate, aluminum nitrate, copper nitrate, nickel chloride, silver nitrate, titanium sulfate, and a combination thereof.

The composition may further include a stabilizer. A stabilizer is a material that stabilizes an oxidant in the presence of a metal complex. If there is no stabilizer, a catalyst and an oxidant may react in a manner that causes rapid deterioration of the oxidant over time.

According to an embodiment of the present invention, the stabilizer may be phosphoric acids, organic acids (such as adipic acid, citric acid, malonic acid, orthophthalic acid and EDTA), phosphate compounds, nitriles, and other ligands that bind to a metal to lower the hydrogen peroxide degradation reactivity thereof, and a mixture thereof. The acid stabilizer may be used in the form of a conjugate. For example, a carboxylate may be used instead of a carboxylic acid. The term "acid" used to describe the stabilizer also refers to a conjugate base of the acid stabilizer. For example, the term "adipic acid" refers to an adipic acid and a conjugate base thereof. The stabilizer may be used alone or in combination, and may significantly reduce the rate at which an oxidant, such as hydrogen peroxide, decomposes. Specifically, the stabilizer may be a phosphoric acid, a phthalic acid, a citric acid, an adipic acid, an oxalic acid, a malonic acid, benzonitrile, and a mixture thereof, more preferably, an amino acid compound that binds to iron ions to exhibit a stabilizing effect, and even more preferably, a malonic acid.

Meanwhile, the composition may further include a pH adjuster to adjust the pH of the composition. In the pH adjuster, one or more of sulfuric acid, hydrochloric acid, nitric acid, carbonic acid, and acetic acid may be used as the acid, while one or more of potassium hydroxide, sodium hydroxide, and ammonia may be used as the base.

According to an embodiment of the present invention, the pH of the composition may be preferably adjusted to be 3 to 4 using the pH adjuster. When the pH is excessively low, a corrosion phenomenon may occur on the surface of the tungsten film. When the pH is excessively high, dispersion stability of the colloidal silica particles may be deteriorated, and the polishing speed of the tungsten film may be lowered.

According to an embodiment of the present invention, the composition may further include a solvent. The solvent is not particularly limited if it is capable of easily dispersing the configuration of the above-described composition. Specifically, the solvent may be one or more selected from water, methanol, ethanol, isopropanol and propylene glycol. When water is used as a solvent, it is preferable to use deionized water (DIW).

A polishing method of a substrate comprising tungsten and a silicon oxide film may include a step of depositing a tungsten-containing metal film on a substrate; a step of forming a silicon oxide film on the substrate; and a step of polishing the substrate with the above-described chemical-mechanical polishing slurry composition. When the composition is washed with a solvent after the above-described chemical-mechanical polishing process, the residual amount of polishing agent at the time of washing 3 times, cumulatively, may be 1.1 to 1.4 fold larger than that of 1 time washing. The residual polishing agent may have a size of 130 mm, but it is not limited thereto. When the residual amount of polishing agent is less than 1.4 fold, the dispersibility is excellent and the number of large particles is small, and thus occurrence of scratches may be reduced during the polishing process, resulting in improvement of the production yield of a final device.

The chemical-mechanical polishing slurry composition may be provided in the form of a 1-liquid type slurry composition including all components such as a polishing agent, a solvent, and other additives, and if necessary, in the form of a 2- or 3-liquid type slurry composition in which the components are separately stored in two containers, or three or more containers, respectively, and then mixed at the point of use or near the point of use. The selection of the form to be provided and the combination of storage components may be dependent on the knowledge of those skilled in the art, and the overall polishing properties and polishing speed may be adjusted by changing the mixing ratio.

The slurry composition of the present invention, as described above, is used in a polishing method for polishing a metal film to form wiring, and in particular, may suitably be used to form wiring by polishing a tungsten metal film.

Meanwhile, a method for manufacturing a semiconductor device according to another aspect of the present invention comprises simultaneously polishing a barrier metal film, a silicon oxide film, and a silicon nitride film using the chemical-mechanical polishing slurry composition. Here, the metal film may be a tungsten metal film. A penetrating electrode may be formed through the polishing step. As the method for simultaneously polishing the barrier metal film, the silicon oxide film, and the silicon nitride film using the above-described chemical-mechanical polishing slurry composition, any conventionally used polishing method under any conventionally used conditions may be performed, and the method is not particularly limited in the present invention. Therefore, detailed descriptions thereof are omitted in the present specification.

The above description of the present invention is provided by way of example. It will be understood by those skilled in the art that the present invention can easily be modified in other specific forms without changing the technical idea or essential features of the present invention. Therefore, it should be understood that the above-described embodiments are not restrictive, but are illustrative in all aspects. For example, each constituent described as a single type may also be distributed and implemented, and similarly, constituents described as being distributed may also be implemented as a combined form.

It should be interpreted that the scope of the present invention is defined by the following claims and all modifications or alterations deduced from the meaning, the scope, and equivalences of the claims are included in the scope of the present invention.

Hereinafter, Examples of the present invention will be described in detail so that those skilled in the art may easily put into practice the present invention. However, the present invention may be implemented in various different forms and is not limited to the Examples provided in the present disclosure.

Comparative Example 1

A polishing slurry composition was prepared by mixing 2 wt % of a colloidal silica polishing agent, a catalyst, a stabilizer, an oxidant, and the remaining amount as water, excluding the amine-based polishing activator and the disaccharide. The pH of the prepared slurry composition was adjusted to 3 adding a pH adjuster.

Example 1

A polishing slurry composition was prepared by mixing 0.05 wt % of ethylenediamine as an amine-based polishing activator, 5 wt % of a colloidal silica polishing agent, a catalyst, a stabilizer, an oxidant, and the remaining amount as water. The pH of the prepared slurry composition was adjusted to 3 by adding a pH adjuster.

Example 2

A polishing slurry composition was prepared in the same manner as in Example 1, except that 0.05 wt % of tetraethylammonium hydroxide was used as the amine-based polishing activator. The pH of the prepared slurry composition was adjusted to 3.

Example 3

A polishing slurry composition was prepared in the same manner as in Example 1, except that 0.05 wt % of tetrahydroxy ethylethylenediamine was used as the amine-based polishing activator. The pH of the prepared slurry composition was adjusted to 3.

Example 4

A polishing slurry composition was prepared in the same manner as in Example 1, except that 0.05 wt % of tetramethylethylenediamine was used as the amine-based polishing activator. The pH of the prepared slurry composition was adjusted to 3.

Example 5

A polishing slurry composition was prepared in the same manner as in Example 1, except that 0.05 wt % of tetraethylethylenediamine was used as the amine-based polishing activator. The pH of the prepared slurry composition was adjusted to 3.

Example 6

A polishing slurry composition was prepared in the same manner as in Example 1, except that 0.05 wt % of tetramethyl ammonium hydroxide was used as the amine-based polishing activator. The pH of the prepared slurry composition was adjusted to 3.

Example 7

A polishing slurry composition was prepared in the same manner as in Example 1, except that 0.05 wt % of tetrahydroxy ethylethylenediamine was used as the amine-based polishing activator and 0.05 wt % of sucrose was used as a disaccharide. The pH of the prepared slurry composition was adjusted to 3.

Example 8

A polishing slurry composition was prepared in the same manner as in Example 7, except that 0.05 wt % of lactose was used as the disaccharide. The pH of the prepared slurry composition was adjusted to 3.

Example 9

A polishing slurry composition was prepared in the same manner as in Example 7, except that 0.05 wt % of maltose was used as the disaccharide. The pH of the prepared slurry composition was adjusted to 3.

Example 10

A polishing slurry composition was prepared in the same manner as in Example 7, except that 0.05 wt % of trehalose was used as the disaccharide. The pH of the prepared slurry composition was adjusted to 3.

Example 11

A polishing slurry composition was prepared in the same manner as in Example 7, except that 0.05 wt % of turanose was used as the disaccharide. The pH of the prepared slurry composition was adjusted to 3.

Test Example 1: Surface Roughness Evaluation 1

The CMP slurry compositions prepared in Examples 1 to 11 and Comparative Example 1 were used for polishing with the following polisher under the following polishing conditions, and surface roughness with respect to the silicon oxide film and the tungsten film was evaluated. Results thereof are shown in Table 1 below.
  Polisher: Poli 400 (manufactured by G&P Technology)
  Wafers: 4*4 cm² flat plate wafer with 15000 Å deposited silicon oxide; and
  4*4 cm² flat plate wafer with 5000 Å deposited amorphous carbon film
    Polishing pad: IC1010 (Dow Chemical Company)
    Polishing time: 60 sec
    Polishing speed: 100 rpm
    Pressure: 210 g/cm²
    Colloidal silica concentration: 5 wt %
    Slurry pH: 3.0

TABLE 1

| W Roughness | Ra before polishing | Rq before polishing | Ra after polishing | Rq after polishing | Ra change amount | Rq change amount |
|---|---|---|---|---|---|---|
| Comparative Example 1 | 25 | 32 | 16 | 21 | 9 | 9 |
| Example 2 | 22 | 29 | 9 | 11 | 13 | 18 |
| Example 3 | 28 | 25 | 8 | 8 | 20 | 17 |

Referring to Table 1, it could be confirmed that the roughness of the tungsten wafer was reduced in Examples 2 and 3, in which the amine-based polishing activator was added, as compared with the Comparative Example. In particular, it could be confirmed that Example 3 showed a remarkable numerical value.

Test Example 2: Surface Roughness Evaluation 2

Evaluation of surface roughness was conducted on Example 3, in which the roughness tended to be significantly reduced in Test Example 1, and on Example 11, to which turanose was further added as a disaccharide. The evaluation results are shown in Table 2 below.

TABLE 2

| W Roughness | Ra before polishing | Rq before polishing | Ra after polishing | Rq after polishing | Ra change amount | Rq change amount |
|---|---|---|---|---|---|---|
| Comparative Example 1 | 25 | 32 | 16 | 21 | 9 | 9 |
| Example 3 | 28 | 25 | 2 | 7 | 27 | 18 |
| Example 11 | 26 | 27 | 2 | 3 | 24 | 24 |

Test Example 3: Evaluation of Residual Amount of Polishing Agent

The compositions of Example 3 and Example 11, in which the surface roughness was seen to be remarkably reduced, were subjected to polishing evaluation and washed once to three times. The residual amount of polishing agent particles having a size of 0.13 μm after washing was measured, and is the results are shown in Table 3 below. The residual amount means the number of residual particles based on the total wafer with a size of 130 mm.

TABLE 3

| 0.13 μm | 1 time washing | 2 times cumulative washing | 3 times cumulative washing |
|---|---|---|---|
| Example 3 | 578 | 645 | 734 |
| Example 11 | 240 | 254 | 288 |

As shown in Table 3, it could be confirmed that when the amine-based polishing activator further included a disaccharide, the residual amount of the polishing agent after the chemical-mechanical polishing process was remarkably reduced.

As shown in the above Test Examples, it could be confirmed that according to an embodiment of the present invention, a tungsten polishing composition which was more improved than the existing products was prepared by controlling the polishing selectivity and the roughness of tungsten and silicon dioxide when using the same polishing agent, while reducing e in addition to controlling the roughness as compared with the conventional slurry composition.

The chemical-mechanical polishing slurry composition according to an embodiment of the present invention may provide effective polishing efficiency and polishing selectivity in tungsten and various films.

In addition, the chemical-mechanical polishing slurry composition according to an embodiment of the present invention may improve the roughness of tungsten and may control the number of particles remaining on the surface of the wafer while maintaining the polishing speed of the wafer on which tungsten is deposited.

It should be understood that the effects of the present invention are not limited to the above-described effects, and include all effects that can be deduced from the detailed description of the present invention or the constitution of the invention described in the claims.

What is claimed is:

1. A chemical-mechanical polishing slurry composition, comprising:
    a polishing agent, an amine-based polishing activator, and a roughness adjusting agent,
    wherein the amine-based polishing activator is a tertiary or quaternary amine, and
    the roughness adjusting agent is a disaccharide, wherein the amine-based polishing activator is any one selected from the group consisting of tetraethylethylenediamine, tetrahydroxy ethylethylenediamine, and a combination thereof,
    wherein the disaccharide is any one selected from the group consisting of lactose, maltose, turanose, and a combination thereof,
    wherein the pH of the composition is adjusted to be 3 to 4.

2. The chemical-mechanical polishing slurry composition of claim 1, wherein the amine-based polishing activator is added in an amount of 1 to 1,000 ppm.

3. The chemical-mechanical polishing slurry composition of claim 1, wherein the disaccharide is added in an amount of 1 to 1,000 ppm.

4. The chemical-mechanical polishing slurry composition of claim 1, further comprising: a polishing agent etching inhibitor.

5. A method for manufacturing a semiconductor device, comprising:
    polishing using a chemical-mechanical polishing slurry composition of claim 1.

* * * * *